United States Patent [19]

Blum et al.

[11] Patent Number: 4,490,673

[45] Date of Patent: Dec. 25, 1984

[54] TESTING AN INTEGRATED CIRCUIT CONTAINING A TRISTATE DRIVER AND A CONTROL SIGNAL GENERATING NETWORK THEREFOR

[75] Inventors: Arnold Blum, Gechingen; Helmut Schettler, Dettenhausen, both of Fed. Rep. of Germany

[73] Assignee: International Business Machines Corporation, Armonk, N.Y.

[21] Appl. No.: 382,267

[22] Filed: May 26, 1982

[30] Foreign Application Priority Data

Oct. 9, 1981 [EP] European Pat. Off. ...... 81 107 134.9

[51] Int. Cl.³ ..................... G01R 31/00; G01R 31/26
[52] U.S. Cl. ............................. 324/158 R; 324/73 R
[58] Field of Search ............ 324/158 R, 158 D, 73 R, 324/73 AT, 158 T

[56] References Cited

PUBLICATIONS

IBM Technical Disclosure Bulletin, vol. 23, No. 7A, Dec. 1980, Logic-Array Isolation for Testing, P. Goel, pp. 2794-2799.
IBM Technical Disclosure Bulletin, vol. 23, No. 1, Jun. 1980, Multiple Input Stage, K. Pollmann, R. Remshardt, H. Schettler & R. Zuehlke, pp. 207-208.
IBM Technical Disclosure Bulletin, vol. 23, No. 9, Feb.1981, Testing of Tristate Driver Circuits, H. D. Schnurmann, L. J. Vidunas, Jr. & C. Y. Wong, pp. 4156-4158.
IBM Technical Disclosure Bulletin, vol. 23, No. 8, Jan. 1981, Testing of Off-Chip Drivers in FET Designs, P. P. Puri & Y. K. Puri, pp. 3798-3799.

*Primary Examiner*—Ernest F. Karlsen
*Attorney, Agent, or Firm*—Douglas A. Lashmit; Mitchell S. Bigel

[57] ABSTRACT

An integrated circuit chip includes a tristate driver which assumes an active logical state in response to a data signal at its data input and assumes a high impedance state in response to a control signal at its control input. The integrated circuit chip also includes a control signal generating network which is connected to the tristate driver's control input for producing the control signal. The control signal generating network may be tested by connecting the control signal generating network to the data input and overriding the control input to prevent the tristate driver from assuming the high impedance state. Thus, for testing purposes, the proper response of the control signal generating circuit may be ascertained by monitoring the active state of the tristate driver.

10 Claims, 2 Drawing Figures

TESTING AN INTEGRATED CIRCUIT CONTAINING A TRISTATE DRIVER AND A CONTROL SIGNAL GENERATING NETWORK THEREFOR

TECHNICAL FIELD

This invention relates to a method and apparatus for testing integrated circuit chips, and more particularly to a method and apparatus for testing integrated circuit chips which include tristate drivers and tristate driver control signal generating networks thereon.

As is well known to those skilled in the art, tristate driver circuits are circuits capable of three states at their output. In two of these states which correspond to the binary values ZERO and ONE (often called active states), the tristate driver circuit is of a low output impedance, whereas in the third state (also called the indifferent state) the tristate driver circuit is characterized by a high output impedance.

In a typical arrangement, a tristate driver includes a pair of inputs, hereinafter referred to as data and control inputs. The tristate driver assumes one of the two active states in response to a data signal at the data input. In response to a control signal at the control input, the tristate driver assumes the high impedance state, regardless of the data signal. Typically, the control signal is generated by a control signal generating network, which may be an array or other combinational network.

Tristate drivers have many uses in electronic arts. For example, assume that several electrically connected integrated circuit chips must be individually tested. When each chip is tested, it must not receive any signals from the other chips which would interfere with the test signals applied. Interference may be precluded if the output of each chip is a tristate driver. Then, when a given chip is tested, the tristate driver circuits of the other chips are brought into the state of high output impedance. The other chips are thus isolated from the chip under test, and the responses of the tested chip to the applied test signal patterns are available at the outputs of its tristate driver circuits. A similar utility is found when several integrated circuit chips are connected to a common output line. When each chip has a tristate driver at the output thereof, the system may be operated so that only one tristate driver is in the active state at one time, so as to preclude interference on the common output line.

Tristate drivers are also important in bi-directional data transmission via transmission lines. During bi-directional data transmission, it must be assured that the driver at only one end of the transmission line is active at one time in order to prevent excessive currents or garbled transmission. By employing tristate drivers at either end of the transmission line, it may be assured that only one end will be active at a time while the other end is in the high impedance state.

BACKGROUND ART

Previously, the tristate driver and the control signal generating network therefor were formed on separate integrated circuit chips. Testing of the tristate driver and the control signal generating network could then be performed separately. However, in state of the art large scale integrated circuits, the control signal generating network and the tristate driver are on the same integrated circuit chip. In such an integrated circuit chip, the control signal generating network can no longer be fully tested, because various test signal patterns applied to the control signal generating network will cause the tristate driver to assume its high impedance state. In the high impedance state however, the response of the tristate driver is no longer available so that the control signal generating network is no longer fully testable.

SUMMARY OF THE INVENTION

It is therefore a primary object of the invention to provide a fully testable integrated circuit chip.

It is another object of the invention to provide an integrated circuit chip which includes a tristate driver and a control signal generating network therefor, wherein the control signal generating network is fully testable.

These and other objects are accomplished by connecting the control signal generating network to the data input for testing purposes, so that the various test signal patterns applied to the control signal generating network will cause the tristate driver to assume its active states. In the active states, the tristate driver's response to the test signal patterns may be readily measured. The control input is also overriden during testing so that the tristate driver cannot assume the high impedance state, regardless of the test signal pattern applied to the control signal generating network. At the conclusion of testing, overriding of the control input ceases, and the control signal generating network once again governs the high impedance state.

In a preferred embodiment of the invention, an OR gate provides the means for connecting the control signal generating network to the data input. A replacement data input is also provided at the OR gate, for application thereto of the data signal after testing has completed. An overriding input connected to the control input provides the means for overriding the high impedance state of the tristate driver during the control signal generating network testing. Of course, other means for connecting the control signal generating network to the data input, as well as other high impedance state overriding means may be provided depending upon the particular integrated circuit chip configuration and device technology.

DETAILED DESCRIPTION OF THE PREFERRED EMBODIMENT

Figure 1:
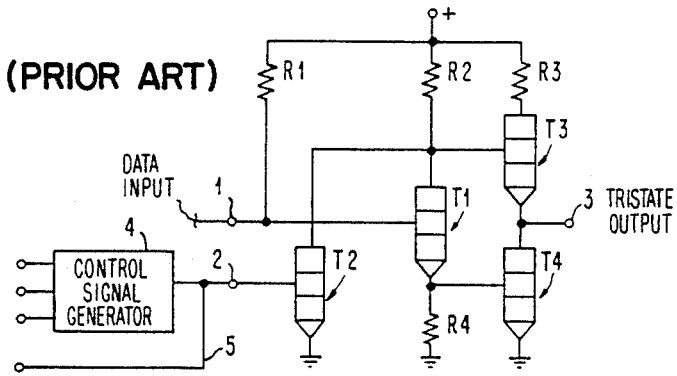
FIG. 1 is a simplified circuit diagram of a known circuit arrangement including a tristate driver and control signal generating network.

Referring now to FIG. 1, there is shown a known tristate driver circuit comprising NPN transistors T1–T4 and resistors R1–R4, and a known control signal generating network 4 connected to control input 2. The control electrode of input transistor T1 of the tristate driver circuit is connected to data input 1. Serially connected transistors T3 and T4 are the output transistors of the tristate driver circuit. The tristate driver output 3 is formed by the point of connection of transistors T3 and T4. The two control electrodes of the output transistors are connected to the collector, and the emitter, respectively, of input transistor T1.

The known circuit arrangement of FIG. 1 operates as follows. If a high potential data signal is applied to data input 1, then input transistor T1 conducts, output transistor T3 turns off and output transistor T4 conducts so that output 3 of the tristate driver is at ground potential. Thus, a high potential at data input 1 is inverted into a low potential at output 3. Conversely, a low potential at data input 1 turns off transistor T1, so that output transistor T4 turns off, while output transistor T3 receives base current via resistor R2. Transistor T3 therefore conducts and supplies a high potential at the output 3 of the tristate driver circuit.

The high output impedance state of the tristate driver circuit, wherein both output transistors T3 and T4 are nonconductive, is governed by a control signal at control input 2 which turns on control transistor T2. Output transistor T3 turns off since it no longer receives any control current. Similarly, output transistor T4 no longer receives any control current, since conductive control transistor T2 prevents current from flowing through input transistor T1. Thus, a high potential at control input 2 causes the tristate driver to assume its high impedance state, while a low potential at control input 2 permits the tristate driver to assume one of its active states in response to a data signal. The high output impedance state of the tristate driver circuit may be tested by means of a signal which is applied to control input 2 via line 5.

When the circuit arrangement of FIG. 1 is formed on a single integrated circuit chip, it becomes impossible to fully test control signal generating network 4, because various test signal patterns applied to the control signal generating network will cause the tristate driver to assume its high impedance state, wherein the response of the tristate driver is no longer available. According to the invention, the control signal generating network is rendered fully testable by connecting the control signal generating network to the data input for testing purposes and overriding the control input as illustrated in FIG. 2.

Figure 2:
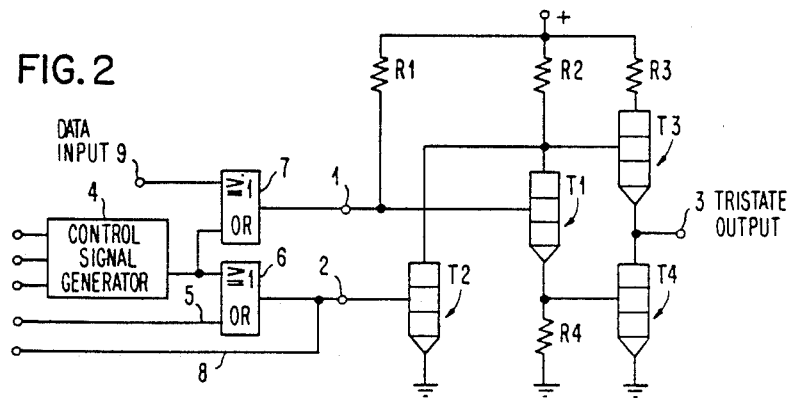
FIG. 2 is a simplified circuit diagram of a circuit arrangement including control signal generating network testing means according to the present invention.

Referring now to FIG. 2, there is shown a circuit arrangement incorporating control signal generating network testing means according to the present invention. Compared with the circuit of FIG. 1, FIG. 2 adds OR gate 6 preceding control input 2 and OR gate 7 preceding data input 1 as well as control line 8 connected to control input 2. Furthermore, the output of control signal generating network 4 is connected to one respective input of OR gates 6 and 7. The second input 9 of OR gate 7 is a replacement data input for application of data signals thereto. Connected to the second input of OR gate 6 is control line 5 to which a signal may be applied to force the tristate driver into its high impedance state.

The circuit of FIG. 2 operates as follows. Early in the test, control line 5 receives a signal which forces the tristate driver circuit into the state of high output impedance. At output 3, it is determined whether the driver has reached the high impedance state. If so, the tristate driver is free of defects with regard to the high impedance state. Control input 2 then receives, via line 8, a potential which prevents control transistor T2 from conducting regardless of the signals supplied by gate 6. This potential is maintained during subsequent testing of control signal generating network 4 so as to override the high impedance state. Overriding the high impedance state is essential since the control signal generating network's responses to the test signal patterns applied thereto are only available at tristate output 3 when it is in an active state.

Testing of control signal generating network 4 may then begin. The output signals of network 4 do not effect the state of high output impedance circuit, but are applied, via gate 7, to data input 1 of the tristate driver circuit and are therefore available at its output in an inverted form. Thus, in accordance with the invention, the output signals of control signal generating network 4 which normally effect the high impedance state do not do so during the testing of the network, so that all responses of the network to the test signal patterns are available at output 3 of the tristate driver circuit.

Whereas we have illustrated and described the preferred embodiment of the invention, it is to be understood that we do not limit ourselves to the precise construction herein disclosed and the right is reserved to all changes and modifications coming within the scope of the invention as defined by the appended claims.

We claim:

1. In an integrated circuit which includes a tristate driver having data and control inputs, said tristate driver assuming an active logical state in response to a data signal at said data input, and assuming a high impedance state in response to a control signal at said control input, said integrated circuit further including a control signal generating network which is connected to said control input for producing said control signal; apparatus for testing said control signal generating network, comprising:
   means for connecting said control signal generating network to said data input so that said tristate driver may assume an active logical state in response to said control signal generating network; and
   overriding means connected to said control input for preventing said tristate driver from assuming the high impedance state;
   whereby said control signal generating network may be tested by monitoring the active logical state of said tristate driver.

2. The apparatus of claim 1 further comprising:
   second overriding means connected to said control input, for forcing said tristate driver into the high impedance state.

3. The apparatus of claim 1 wherein said connecting means comprises a logic gate, the output of which is connected to said data input, and one input of which is connected to said control signal generating network.

4. The apparatus of claim 3 wherein said logic gate is an OR gate.

5. The apparatus of claim 3 further comprising a replacement data input connected to another input of said logic gate.

6. The apparatus of claim 2 wherein said second overriding means comprises a logic gate, the output of which is connected to said control input and one input of which is connected to said control signal generating network.

7. The apparatus of claim 6 wherein said logic gate is an OR gate.

8. The apparatus of claim 1 wherein said control signal generating network is a combinational network.

9. In an integrated circuit which includes a tristate driver having data and control inputs, said tristate driver assuming an active logical state in response to a data signal at said data input, and assuming a high impedance state in response to a control signal at said control input, said integrated circuit further including a control signal generating network, the output of which is connected to said control input for producing said control signal; a method for testing said control signal generating network comprising the steps of:

connecting said control signal generating network to said data input so that said tristate driver assumes an active logical state in response to said control signal generating network; and overriding said control input to prevent said tristate driver from assuming the high impedance state;

whereby said control signal generating network may be tested by monitoring the active logical state of said tristate driver.

10. The method of claim 9 wherein said connecting step is preceded by the step of overriding said control input to force said tristate driver into the high impedance state.

* * * * *